US 6,580,125 B2

(12) United States Patent
Kitabatake et al.

(10) Patent No.: US 6,580,125 B2
(45) Date of Patent: Jun. 17, 2003

(54) SEMICONDUCTOR DEVICE AND METHOD FOR FABRICATING THE SAME

(75) Inventors: Makoto Kitabatake, Nara (JP); Toshiya Yokogawa, Nara (JP); Osamu Kusumoto, Nara (JP); Masao Uchida, Osaka (JP); Kunimasa Takahashi, Osaka (JP); Kenya Yamashita, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/204,097

(22) PCT Filed: Sep. 7, 2001

(86) PCT No.: PCT/JP01/07810

§ 371 (c)(1),
(2), (4) Date: Aug. 15, 2002

(87) PCT Pub. No.: WO02/43157

PCT Pub. Date: May 30, 2002

(65) Prior Publication Data

US 2003/0020136 A1 Jan. 30, 2003

(30) Foreign Application Priority Data

Nov. 21, 2000 (JP) ........................................ 2000-353700

(51) Int. Cl.[7] .............................................. H01L 29/76
(52) U.S. Cl. ........................ 257/335; 257/339; 257/342; 257/77; 257/345; 257/194
(58) Field of Search ................................ 257/335, 339, 257/342, 345, 77, 194

(56) References Cited

U.S. PATENT DOCUMENTS 6,455,892 B1 * 9/2002 Okuno et al. ............... 257/328

FOREIGN PATENT DOCUMENTS

| EP | 700093 | 3/1996 |
|----|--------|--------|
| JP | 61-27681 | 2/1986 |
| JP | 61-230374 | 10/1986 |

OTHER PUBLICATIONS

Onda, et al., "SiC Integrated MOSFETs", Research Laboratories, Denso Corporation, Aichi, Japan; phys. stat. sol. (a) 162, pp. 369–388, (1997).
International Search Report, PCT/JP01/07810, ISA/JPO, Dec. 3, 2001.

* cited by examiner

Primary Examiner—Mark V. Prenty
(74) Attorney, Agent, or Firm—Harness, Dickey & Pierce, P.L.C.

(57) ABSTRACT

A DMOS device (or IGBT) includes an SiC substrate 2, an n-SiC layer 3 (drift region) formed in an epitaxial layer, a gate insulating film 6, a gate electrode 7a, a source electrode 7b formed to surround the gate electrode 7a, a drain electrode 7c formed on the lower surface of the SiC substrate 2, a p-SiC layer 4, an n$^+$ SiC layer 3 formed to be present from under edges of the source electrode 7b to under associated edges of the gate electrode 7a. In addition, the device includes an n-type doped layer 10a containing a high concentration of nitrogen and an undoped layer 10b, which are stacked in a region in the surface portion of the epitaxial layer except the region where the n$^+$ SiC layer 5 is formed. By utilizing a quantum effect, the device can have its on-resistance decreased, and can also have its breakdown voltage increased when in its off state.

8 Claims, 11 Drawing Sheets

Flow of Electrons

Flow of Electrons    Flow of Holes

SEMICONDUCTOR DEVICE AND METHOD FOR FABRICATING THE SAME

TECHNICAL FIELD

The present invention relates to a semiconductor device functioning as a high-breakdown-voltage semiconductor power device to be placed in an inverter, for example, and more particularly relates to a method for increasing the current driving capacity and breakdown voltage of the device.

BACKGROUND ART

A semiconductor device, in which an insulating gate electrode and source electrodes are formed on the upper surface side of a semiconductor substrate and a drain electrode is formed on the lower surface side thereof so that a wide region in the semiconductor substrate is used for passing a large current in a vertical direction, is conventionally known as a semiconductor power device to be placed in an inverter, for example.

FIG. 4 is a cross-sectional view of a semiconductor power device called a DMOS device, which is disclosed in the document (Silicon Carbide; A Review of Fundamental Questions and Applications to Current Device Technology, edited by W. J. Choyke, H. Matsunami, and G. Pensl, Akademie Verlag 1997 Vol.II pp.369–388).

As shown in the drawing, the semiconductor power device includes: an SiC substrate 111 (6H—SiC substrate) containing an n-type impurity at a high concentration; an n-SiC layer 112 (drift region), which is formed in an epitaxial layer formed on the SiC substrate 111 and which contains an n-type impurity at a low concentration; a gate insulating film 116 formed on the epitaxial layer; a gate electrode 118 formed on the gate insulating film; source electrodes 119 formed so as to surround the gate electrode 118 on the epitaxial layer; a drain electrode 117 formed on the lower surface of the SiC substrate 111; p-SiC layers 113 formed by doping, with a p-type impurity, regions in the epitaxial layer, each of which is present from under each source electrode 119 to under associated edges of the gate electrode 118; n⁺ SiC layers 114 formed by doping regions in the epitaxial layer that are located under the edges of the source electrodes 119 with an n-type impurity at a high concentration. In the semiconductor power device, the n⁺ SiC layers 114 function as source regions, regions in the p-SiC layers 113 that are located near the interface with the gate insulating film 116 function as a channel region, and the SiC substrate 111 and the n-SiC layer 112 function as a drain region. The n-SiC layer 112, in which carriers move due to drift diffusion, is typically called a drift region. When the semiconductor power device is turned ON, a voltage of about 5 V is applied to the gate electrode 118, the source electrodes 119 are grounded, and a voltage of several volts is applied to the drain electrode 117. At this time, by an operation similar to that performed in an ordinary MOSFET, a current flows from a region in the n-SiC layer 112, which is located under the gate electrode 118, to the n⁺ SiC layers 114 through the p-SiC layers 113.

Specifically, the semiconductor power device (DMOS device) has the structure in which the pattern of the gate electrode 118 and the source electrode 119 is formed over a wide range over the SiC substrate 111 so that a large current can flow in a vertical direction through a wide region in the substrate. Particularly, since SiC has a wide bandgap, the semiconductor power device can exhibit a breakdown voltage higher than a semiconductor power device using an Si substrate.

An IGBT is also known as a power device in which a current flows in a vertical direction. The basic structure of an IGBT is substantially the same as that of a DMOS device, except that a drift region and a semiconductor substrate show mutually opposite conductivity types in the IGBT. In a DMOS device, an n-type epitaxial layer is grown on an n-type substrate, for example. However, for the case of an IGBT, an n-type epitaxial layer is grown on a p-type substrate, for example. For instance, if a p-type substrate rather than the n-type one is provided as the SiC substrate 111 shown in FIG. 4, an IGBT can be formed.

PROBLEMS THAT THE INVENTION INTENDS TO SOLVE

However, the semiconductor power devices such as the conventional DMOS device and IGBT have the following drawbacks.

When the DMOS device or IGBT is reverse-biased, depletion layers 115 are extensively created in the n-SiC layer 112 (drift region) as shown by the dashed lines in FIG. 4. In that situation, the width of the depletion layers 115 narrows in the surface portion of the n-SiC layer 112 that is located under the gate electrode 118. As a result, an electric field that is applied to the depletion layers 115 increases in the surface portion of the n-SiC layer 112 serving as the drift region. Therefore, a dielectric breakdown is likely to be caused in this portion.

In addition, in order to increase the breakdown voltage of the conventional DMOS device or IGBT, the p-SIC layers 113 need to have their impurity concentration increased. In that case, however, the channel resistance is increased and thus the current driving power decreases. That is, there is a trade-off relationship between low resistance and high breakdown voltage. This imposes limitations on improvement of the performance of the semiconductor power device.

DISCLOSURE OF INVENTION

An object of the present invention is to provide a semiconductor device which functions as a semiconductor power device having a high current-driving-power and a high breakdown voltage by lessening the trade-off between low resistance and high breakdown voltage.

An inventive semiconductor device includes: a semiconductor substrate; a compound semiconductor layer formed on the principal surface of the semiconductor substrate; a gate insulating film formed on the compound semiconductor layer; a gate electrode formed on the gate insulating film; a source electrode formed at a side of the gate electrode on the compound semiconductor layer; a drain electrode formed on a face of the semiconductor substrate, the face being opposed to the principal surface of the semiconductor substrate; a source region, which is formed in the compound semiconductor layer and contains an impurity of a first conductivity type, the source region being present from under a part of the source electrode to under associated edges of the gate electrode; an active region, which is formed in the compound semiconductor layer, contains an impurity of the first conductivity type, and functions as a region where carriers travel, the active region being located beneath the gate electrode; a drift region, which is formed in the compound semiconductor layer and contains an impurity of the first conductivity type, the drift region being located under the gate electrode; an oppositely doped region, which is formed between the drift region and the source region in the compound semiconductor layer and contains an impurity of a second conductivity type, wherein the active region includes one or more first semiconductor layers and one or more second semiconductor layers which contain an impurity for carriers at a concentration higher than the one or more first semiconductor layers and are smaller in film thickness than the one ore more first semiconductor layers and from which carriers spread out to the one or more first semiconductor layers due to a quantum effect.

In the inventive device, quantum levels resulting from a quantum effect occur in the second semiconductor layer in the active region, and the wave function of carriers localized in the second semiconductor layer expands to a certain degree. What results is a state of distribution in which carriers are present not only in the second semiconductor layer but also in the first semiconductor layer. In other words, the resultant state is that carriers have spread out from the second semiconductor layer to the first semiconductor layer due to a quantum effect. If the potential of the active region is increased in this state, carriers are constantly supplied to the first and second semiconductor layers, and the carriers travel in the first semiconductor layer that is low in impurity concentration. This reduces scattering by impurity ions, allowing a high channel mobility to be obtained. On the other hand, when the device is in the off state, the whole active region is depleted and carriers are not present in the active region. Consequently, the breakdown voltage is defined by the first semiconductor layer which is low in impurity concentration, so that a high breakdown voltage can be obtained in the entire active region. Accordingly, in the device having the structure in which the active region of the first conductivity type is utilized so that a large current can flow between the source and drain, a high channel mobility and a high breakdown voltage can be achieved at the same time.

When the semiconductor substrate is of the first conductivity type, the above-mentioned effects can be attained in a semiconductor device functioning as an ACCUFET.

When the semiconductor substrate is of the second conductivity type, the above-mentioned effects can be attained in a semiconductor device functioning as an IGBT.

When the active region is formed by stacking a plurality of the first semiconductor layers and a plurality of the second semiconductor layers, the above-mentioned effects can be attained with certainty.

The one ore more second semiconductor layers are preferably made of silicon carbide, and the thickness of each of the one or more second semiconductor layers is preferably at least one monolayer and less than 20 nm.

The one or more first semiconductor layers are preferably made of silicon carbide, and the thickness of each of the one or more first semiconductor layers is preferably not less than 10 nm and not more than 100 nm.

When the inventive device further includes at least one heavily doped layer, which is formed laterally in the drift region to extend throughout the entire area of the drift region and which contains an impurity of the first conductivity type at a concentration higher than the drift region, it is ensured that depletion layers expand horizontally, which provides a semiconductor device having a higher breakdown voltage.

When the inventive device further includes an opening that reaches the oppositely doped region through the source region, wherein the source electrode is formed on wall surfaces of the opening and is in direct contact with a part of the source region and a part of the oppositely doped region, the source electrode can be formed on a region other than a region whose surface is in a bad condition or which has many defects therein. Thus, characteristics such as a high breakdown voltage can be obtained.

An inventive method for fabricating a semiconductor device includes the steps of (a) forming a compound semiconductor layer of a first conductivity type on the principal surface of a semiconductor substrate; (b) forming an oppositely doped region by introducing an impurity of a second conductivity type into a part of the compound semiconductor layer; (c) forming, on the compound semiconductor layer and the oppositely doped region, an active region including one or more first semiconductor layers and one or more second semiconductor layers which contain an impurity for carriers at a concentration higher than the one ore more first semiconductor layers and are smaller in film thickness than the one or more first semiconductor layers and from which carriers spread out to the one or more first semiconductor layers due to a quantum effect; (d) forming a source region by introducing an impurity of the first conductivity type into at least an area of the active region, the area being located on the oppositely doped region; (e) forming an opening that reaches the oppositely doped region by removing a part of the active region, the part being located on the oppositely doped region; (f) forming a gate insulating film on the active region; (g) forming a source electrode that is in contact with both a part of the source region and a part of the oppositely doped region, the parts being exposed within the opening; and (h) forming a gate electrode on the gate insulating film.

According to the inventive method, the source electrode and the oppositely doped region can be in contact with each other without introducing, into the source region, an impurity of the same conductivity type as that of the oppositely doped region in the step (e). Thus, a semiconductor device functioning as a high-performance ACCUFET or IGBT can be provided.

In the step (a), the compound semiconductor layer is preferably formed by an epitaxial growing method using in-situ doping with an impurity of the first conductivity type.

When in the steps (a) and (c), SiC layers are formed as the compound semiconductor layer and the active region, respectively, provided is a semiconductor device that functions as a power device utilizing the SiC layers with a wide bandgap and a high breakdown voltage. In that case, since the impurity ions implanted have a low activation rate in the SiC layers, defects are likely to occur in a region defined by the ion implantation. By forming the source electrode in the opening, however, it is possible to avoid the creation of such a region having many defects.

BEST MODE FOR CARRYING OUT THE INVENTION

First Embodiment

Figure 1:
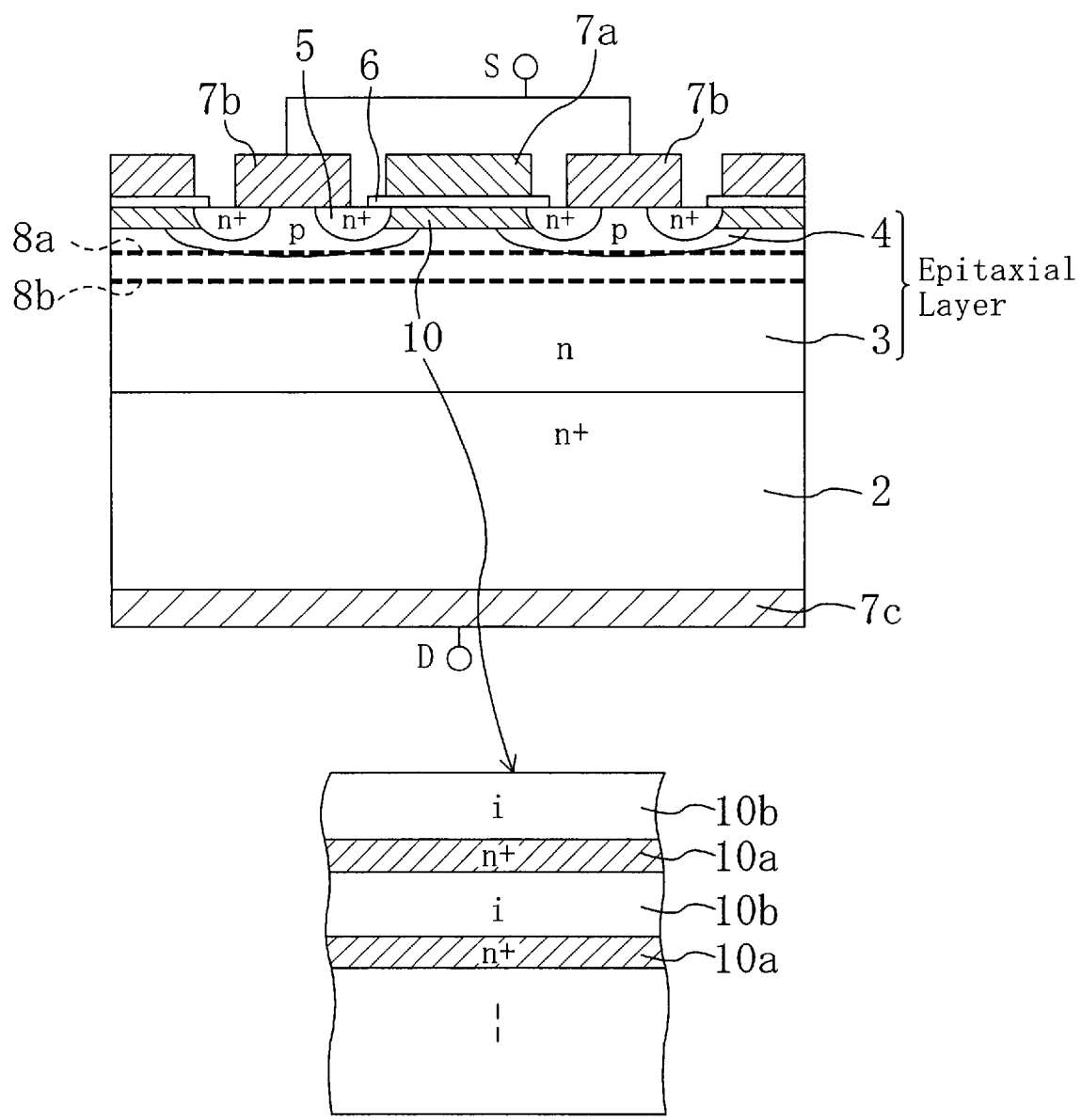
FIG. 1 is a cross-sectional view of a DMOS device according to a first embodiment of the present invention.
Figure 2:
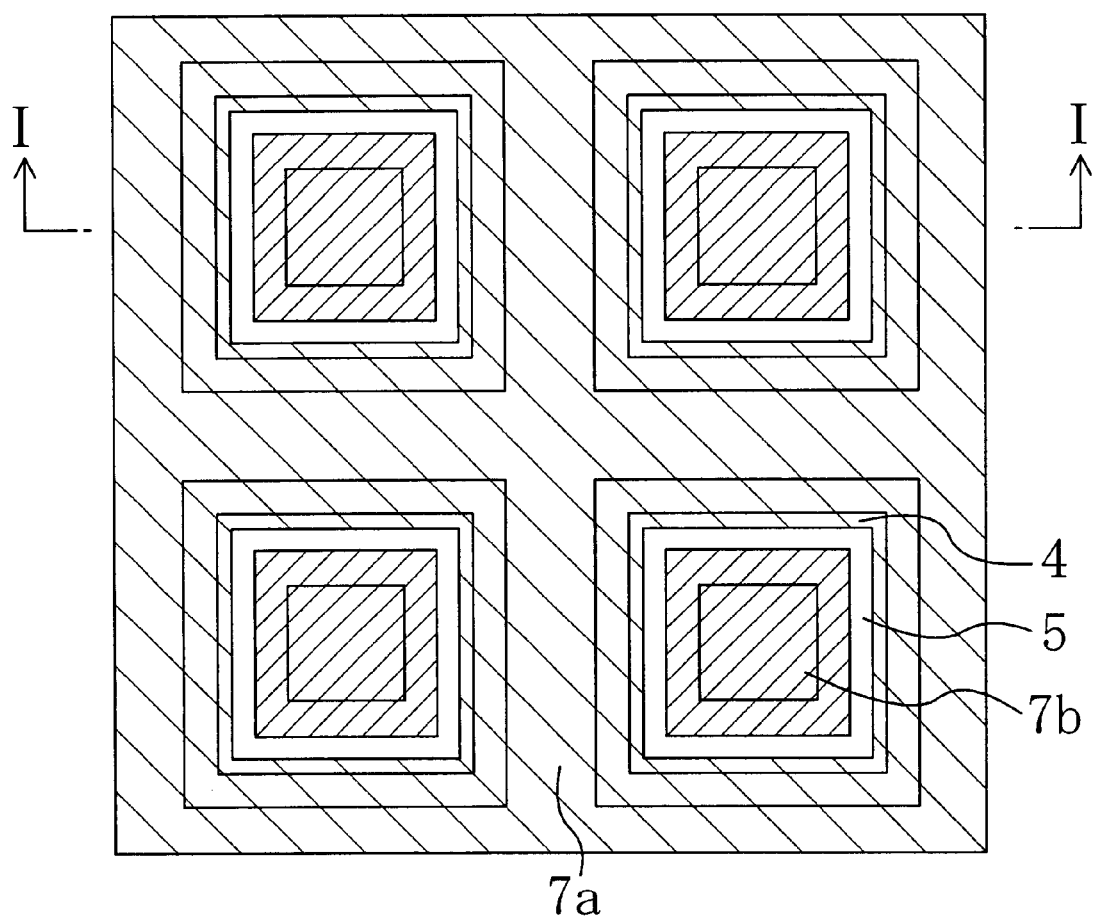
FIG. 2 is a top view illustrating how the cells of the DMOS device of the first embodiment of the present invention are arranged.

FIG. 1 illustrates a cross-sectional structure of a cell of a DMOS device according to a first embodiment of the present invention. FIG. 2 is a top view illustrating the DMOS device of this embodiment. As shown in FIGS. 1 and 2, the cell of the DMOS device of this embodiment includes: an SiC substrate 2 (6H—SiC substrate), which contains an n-type impurity at a high concentration and the major surface of which is a (0001) off face; an n-SiC layer 3 (drift region), which is formed in an epitaxial layer formed on the SiC substrate 2 and which contains an n-type impurity at a low concentration; a gate insulating film 6 formed on the epitaxial layer; a gate electrode 7a formed on the gate insulating film; source electrodes 7b, which are formed so as to surround the gate electrode 7a on the epitaxial layer; a drain electrode 7c formed on the lower surface of the SiC substrate 2; p-SiC layers 4 formed by doping, with a p-type impurity, regions in the epitaxial layer, each of which is present from under each source electrode 7b to under associated edges of the gate electrode 7a; n$^+$ SiC layers 5 formed by doping, with an n-type impurity at a high concentration, regions in the epitaxial layer, each of which is present from under the edges of each source electrode 7b to under associated edges of the gate electrode 7a.

The first characteristic of this embodiment is that a multiple δ-doped layer (active region) is formed in the surface portion of the epitaxial layer except in the portions where the n+ SiC layers 5 are formed. This allows the DMOS device of this embodiment to function as a so-called "ACCUFET (Accumulation Mode FET)".

As shown in the lower part of FIG. 1 under magnification, the multiple δ-doped layer 10 is formed by alternately stacking five n-type doped layers 10a each containing nitrogen at a high concentration (for example, $1 \times 10^{18}$ atoms/cm$^3$) and having a thickness of about 10 nm in between six undoped layers 10b each made of an undoped SiC single crystal and having a thickness of about 50 nm, so that each of the uppermost and lowermost layers is the undoped layer 10b. The total thickness is about 350 nm.

In the semiconductor power device, the n$^+$ SiC layers 5 function as source regions, the multiple δ-doped layer 10 functions as a channel region, and the SiC substrate 2 and the n-SiC layer 3 function as a drain region.

In the multiple δ-doped layer 10, quantum levels resulting from a quantum effect occur in the n-typed doped layers 10a, and the wave function of electrons localized in the n-type doped layers 10a expands to a certain degree. What results is a state of distribution in which electrons are present not only in the n-type doped layers 10a but also in the undoped layers 10b.

When the semiconductor power device is turned ON, a voltage of about 5 V is applied to the gate electrode 7a, the source electrodes 7b are grounded, and a voltage of about 600 V is applied to the drain electrode 7c. At this time, the potential of the multiple δ-doped layer 10 is increased, the wave function of electrons expands from the n-type doped layers 10a to the undoped layers lob due to a quantum effect, and electrons are constantly supplied to the n-type doped layers 10a and the undoped layers 10b. Since the electrons travel through the undoped layers 10b having a low impurity concentration, scattering by impurity ions is reduced and a high channel mobility can be obtained. When a current flows, the drain voltage decreases to several volts.

Particularly, where a thermal oxide film is formed as a gate oxide film on an SiC substrate, impurities such as carbon remain in the silicon oxide film, causing many interface states to exist near the interface between the gate oxide film and an SiC channel region (active region). For that reason, in an inversion-type MOSFET using a known SiC substrate, carriers traveling in a region of the active region, which is near the gate oxide film, have a low mobility. Thus, in the known inversion-type MOSFET, a channel where carriers travel is formed in the region having many interface states in the active region, that is, the region near the interface of poor quality, resulting in reduction in the amount of current flowing in the FET.

For the case of the active region in the MOSFET of this embodiment, however, electrons travel in the undoped layers 10b that are away from the interface and are not likely to be affected by the poor-quality interface. Thus, the electrons can have their mobility increased, leading to increase in the amount of current flowing in the FET.

Also, in an ordinary ACCUFET, an entire active region (corresponding to the multiple δ-doped layer 10 in this embodiment) has a substantially uniform impurity concentration except in source/drain regions. In that case, the higher the impurity concentration is, the more electrons are supplied. However, as the impurity concentration in the active region increases, the electrons are more likely to be scattered by the impurities when traveling, causing the mobility of the electrons to decrease. In other words, the channel resistance of the FET increases and thus large current and high-speed operation cannot be assured. Specifically, the impurity concentration of the active region ranges from about $1 \times 10^{16}$ cm$^{-3}$ to about $1 \times 10^{17}$ cm$^{-3}$ except in the source/drain regions.

Further, as the impurity concentration is increased in the active region except the source/drain regions, the breakdown voltage decreases. For the case of the ACCUFET of this embodiment, however, in the active region except the source/drain regions, the doped layers having a high impurity concentration are so thin that decrease in breakdown voltage can be suppressed by the undoped layers that are thick and have a low impurity concentration. When a current flows, the drain voltage decreases to several volts.

At this time, in the n-SiC layer 3, a current flows in a wide region through the whole multiple δ-doped layer 10 located under the gate electrode 7a, which enables a particularly high current value to be obtained. It was confirmed that this has the effect of expanding a conductive path for carriers and also reducing conduction loss. In contrast, in the known DMOS device shown in FIG. 4, a current is confined in a narrow region in the n-SiC layer 112, a current value obtainable is not so large.

On the other hand, in the device of this embodiment in its off state, the whole multiple δ-doped layer 10 is depleted and electrons are not present in the multiple δ-doped layer 10. Consequently, the breakdown voltage is defined by the undoped layers 10*b* which are low in impurity concentration so that a high breakdown voltage can be obtained in the entire multiple δ-doped layer 10.

Accordingly, in this embodiment, the ACCUFET having the structure in which the multiple δ-doped layer 10 is utilized so that a large current can flow between the source and drain regions can achieves a high channel mobility and a high breakdown voltage at the same time.

Moreover, since the undoped layers 10*b* are low in impurity concentration, by using the multiple δ-doped layer 10 as a channel layer, the channel mobility can be increased because of reduction in the amount of charge trapped in the gate insulating film 6 and in the vicinity of the interface between the gate insulating film and the multiple δ-doped layer 10 and because of reduced scattering of impurity ions, and the breakdown voltage can also be increased.

Although characterized by having a large saturation current value and a small on-resistance, ACCUFETs have not yet been put to practical use. One of the major reasons for this is that the ACCUFETs have a low breakdown voltage in the off state. However, by using the multilayer structure of the δ-doped and undoped layers, the ACCUFET of this embodiment can have its current driving power further increased while keeping the breakdown voltage at a high value when in the off state.

In this embodiment, provided is the multiple δ-doped layer 10 formed by alternately stacking the heavily doped layers (δ-doped layers) in between the lightly doped layers (undoped layers). However, the multiple δ-doped layer 10 may include only one heavily doped layer and one lightly doped layer. Either of the heavily doped layer and the lightly doped layer may be formed first. Alternatively, one heavily doped layer may be provided with a lightly doped layer (undoped layer) thereon and another lightly doped layer thereunder. In other words, the number of heavily doped layers may be different from that of lightly doped layers. The uppermost layer that is in direct contact with the gate insulating film 6 is preferably an undoped layer.

The second characteristic of this embodiment is that a couple of heavily doped layers 8*a* and 8*b* each containing nitrogen at a high concentration ($1 \times 10^{18}$ atoms/cm$^{-3}$, for example) and having a thickness of about 100 nm are formed in the n-SiC layer 3. The spacing between the two heavily doped layers 8*a* and 8*b* is about 500 nm.

Figure 4:
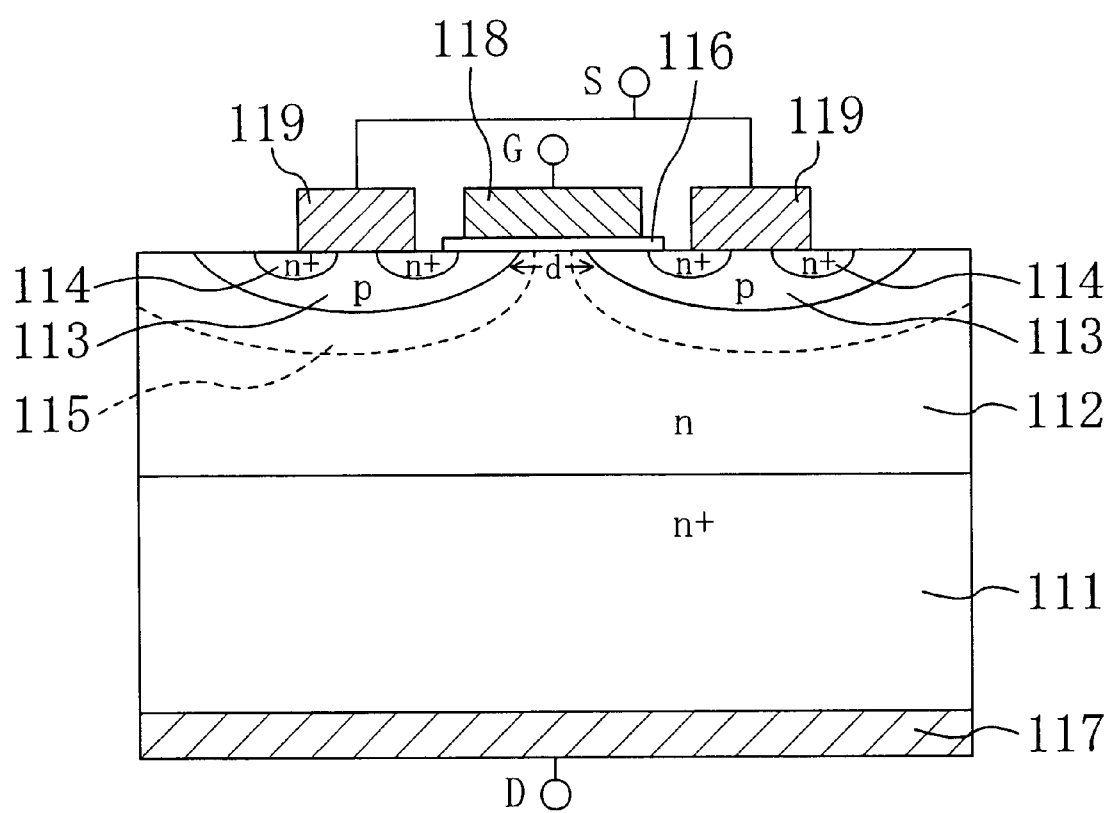
FIG. 4 is a cross-sectional view of a DMOS device which is disclosed in a known document.
Figure 5:
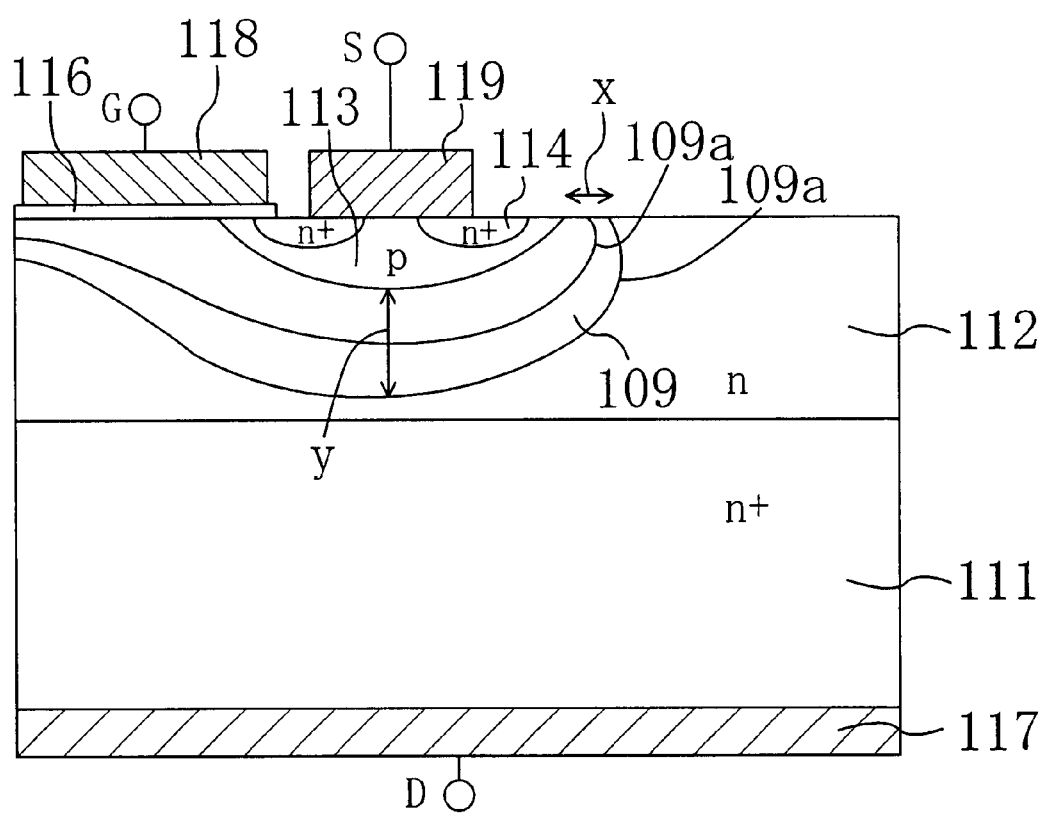
FIG. 5 is a cross-sectional view showing how the depletion layers expand in the DMOS device using the known SiC substrate shown in FIG. 4 when the device is in its off state.

FIG. 5 is a cross-sectional view showing how a depletion layer expands in the DMOS device using the known SiC substrate shown in FIG. 4 when the device is in its off state. As shown in the drawing, when a voltage of about 600 V is applied to the drain electrode 117 while an off voltage (0 V, for example) is applied to the gate electrode 118 and the source electrodes 119 are grounded, the depletion layer 109 expands vertically and horizontally in the n-SiC layer 112. At this time, the expansion of the depletion layer in the horizontal direction as indicated by the arrow x in the drawing is smaller than the expansion of the depletion layer in the vertical direction (i.e., the thickness direction) as indicated by the arrow y in the drawing. This is, the horizontal spacing between equipotential planes 109*a* is narrower than the vertical spacing between the equipotential planes 109*a*. The result is the electric field within the depletion layer 109 becomes largest near the edge of the bottom face of the gate electrode 118. Thus, a dielectric breakdown occurs easily at this portion.

Figure 3:
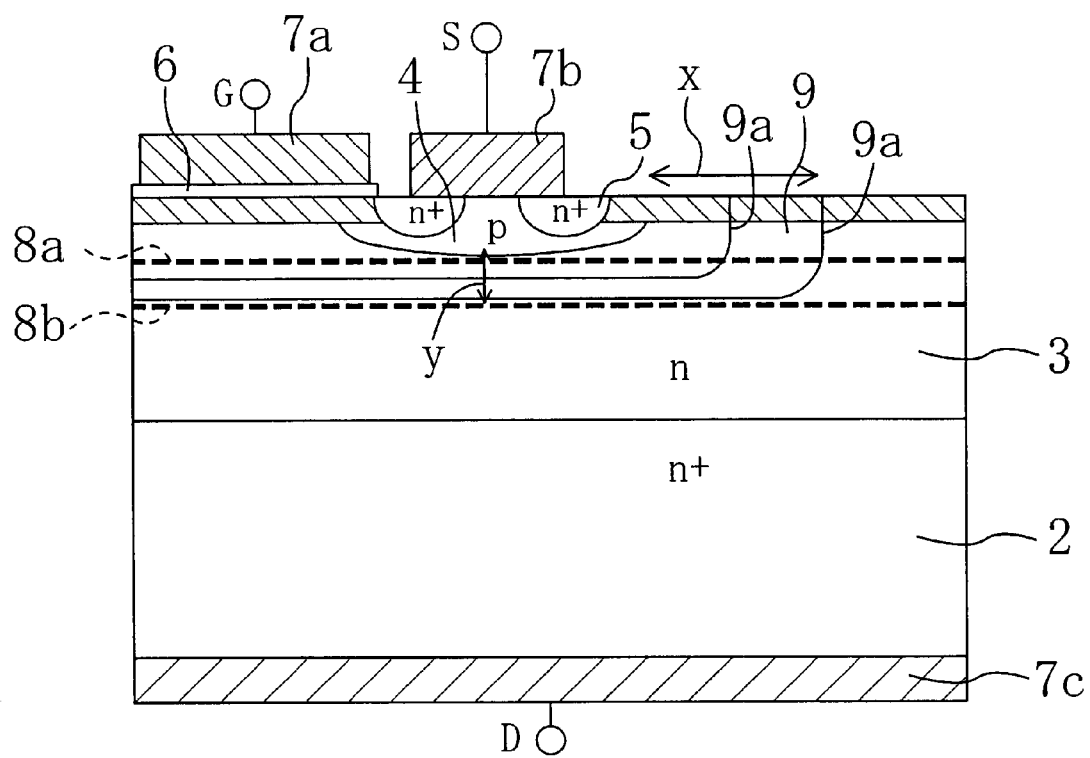
FIG. 3 is a cross-sectional view showing the expansion of a depletion layer in a cell of the DMOS device, which is in its off state, according to the first embodiment of the present invention.

FIG. 3 is a cross-sectional view illustrating the expansion of a depletion layer in a cell of the DMOS device of this embodiment in its off state. In the DMOS device, the heavily doped layers are provided in the n-SiC layer 112. When a voltage of about 600 V is applied to the drain electrode 7*c* while an off voltage (0 V, for example) is applied to the gate electrode 7*a* and the source electrodes 7*b* are grounded, the depletion layer 9 expands vertically and horizontally in the n-SiC layer 3. In this situation, the heavily doped layers act just like electrodes that have been inserted into a drift region (here the n-SiC layer 3). Therefore, when the depletion layer 9 spreading outward in the vertical direction (i.e., the thickness direction) as indicated by the arrow y in the drawing comes into contact with the heavily doped layers 8*a* and 8*b*, the heavily doped layers 8*a* and 8*b* temporarily suppress the depletion layer 9 from spreading further downward. For that reason, the expansion of the depletion layer 9 in the horizontal direction, as indicated by the arrow x in the drawing becomes larger than the expansion of the depletion layer 9 in the vertical direction. That is, the spacing between the equipotential planes 9*a* in the horizontal direction becomes wider than the spacing between the equipotential planes 9*a* in the vertical direction. As a result, the concentration of the electric field in the depletion layer 9 near the edge of the bottom face of the gate electrode 7*a* disappears almost completely. Further, since the equipotential lines 9*a* in the depletion layer 9 are formed almost in parallel with the heavily doped layers 8*a* and 8*b*, vertical electric fields in the depletion layer 9 do not concentrate locally but occur uniformly throughout a wide area. Thus, a dielectric breakdown is not likely to occur. Therefore, the DMOS device of this embodiment has a higher breakdown voltage value (at least about 600 V) as compared with the known DMOS device shown in FIG. 4.

Note that this effect can be obtained regardless of the presence or absence of the multiple δ-doped layer 10. Accordingly, although the multiple δ-doped layer 10 and the heavily doped layers 8*a* and 8*b* are both provided in this embodiment, the breakdown voltage of the DMOS device can be increased by providing only the multiple δ-doped layer 10 or the heavily doped layers 8*a* and 8*b*.

Particularly, where the multiple δ-doped layer 10 is provided, the device functions as an ACCUFET and thus can obtain a characteristic of being high in saturation current value.

On the other hand, where only the heavily doped layers 8*a* and 8*b* are provided without providing the multiple δ-doped layer 10, the breakdown voltage can be increased although the effect of increasing the saturation current value can not be expected. In that case, the number of the heavily doped layer does not have to be one as in this embodiment but may be one or two or more. Generally, as the number of heavily doped layers increases, the DMOS device has a greater breakdown voltage.

Next, a fabrication process of a DMOS device according to this embodiment will be described. First, an n$^+$-type SiC substrate 2, the principal surface of which is inclined from the (0001) plane (i.e., C plane) by several degrees, is prepared. The SiC substrate 2 has a diameter of 25 mm. First, the SiC substrate 2 is thermally oxidized at 1100° C. for about three hours in a water vapor atmosphere through which oxygen is bubbled at a flow rate of 5 (l/min), and once a thermal oxide film of about 40 nm thickness is formed on the surface, the thermal oxide film is removed with buffered hydrofluoric acid (hydrofluoric acid:aqueous solution of ammonium fluoride=1:7). Then, the SiC substrate 2 is placed into a chamber in a CVD apparatus and the pressure inside the chamber is reduced until it reaches a vacuum degree of about $10^{-6}$ Pa ($\approx 10^{-8}$ Torr). Next, hydrogen and argon gases are supplied as dilution gases into the chamber at respective flow rates of 2 (l/min) and 1 (l/min), and the pressure inside the chamber is set to 0.0933 MPa. The temperature of the substrate is controlled to about 1600° C. Then, propane and silane gases are supplied as source gases into the chamber at respective flow rates of 2 (ml/min) and 3 (ml/min), while the flow rates of the hydrogen and argon gases are held at the above-mentioned constant values. These source gases have been diluted with hydrogen gas with a flow rate of 50 (ml/min). Then, by opening a pulse valve for supplying a doping gas so as to introduce nitrogen, an n-SiC layer 3 of about 10 µm thickness, which contains a low concentration (about $1 \times 10^{16}$ atoms/cm$^{-3}$) of nitrogen and which is made of an n-type single SiC crystal, is formed on the principal surface of the SiC substrate 2. During the formation of the n-SiC layer 3, a couple of heavily doped layers 8a and 8b having an impurity concentration of $1 \times 10^{18}$ atoms/cm$^{-3}$, for example, are formed in two portions in the n-SiC layer 3.

However, as disclosed in the specification and drawings of Japanese Patent Application 2000-58964, in order to supply a hydrogen gas containing about 10% nitrogen as a doping gas, the doping gas is stored in a high-pressure cylinder, and the pulse valve is provided between the high-pressure cylinder and a pipe for supplying the doping gas.

Then, aluminum (Al) ions are selectively implanted into parts of the n-SiC layer 3 for forming p-SiC layers 4 each having a depth of about 1000 nm. Thereafter, a multiple δ-doped layer 10 is formed by the following procedures.

First, while the process conditions, such as the amounts of the source and dilution gases supplied and the temperature, under which the n-SiC layer 3 was formed are kept unchanged, by closing the pulse valve, an undoped layer 10b (the impurity concentration of which is confirmed to be about $5 \times 10^{15}$ cm$^{-3}$) is formed to have a thickness of 50 nm on the n-SiC layer 3. Next, while the conditions, such as the amounts of the dilution and source gases supplied into the chamber and the temperature, are still kept constant, the pulse valve is opened so that a pulsed gas (i.e., doping gas) containing aluminum as a p-type impurity is supplied. In this way, an n-type doped layer 10a (i.e., heavily doped layer) (the impurity concentration of which is about $1 \times 10^{18}$ cm$^{-3}$) is formed to have a thickness of about 10 nm on the undoped layer 10b.

In this manner, each of the step of forming the n-type doped layer 10a by introducing the doping gas (nitrogen) through opening and closing of the pulse valve while simultaneously supplying the source and dilution gases, and the step of forming the undoped layer 10b by supplying only the source and dilution gases without supplying the doping gas by keeping the pulse valve closed, is repeated five times. Finally, as the uppermost layer, the undoped layer 10b of 50 nm thickness is formed. By the foregoing process, the multiple δ-doped layer 10 of about 350 nm thickness is formed.

Note that the undoped layer 10b serving as the uppermost layer of the multiple δ-doped layer 10 may have a thickness larger by about 50 nm than that of each of the other undoped layers 10b. In that case, the threshold voltage of the DMOS device increases. Thus, the thickness of the uppermost undoped layer 10b may be determined so that the channel mobility and the threshold voltage, harmfully affected by interface states present at the interface between the gate insulating film and the multiple δ-doped layer, are appropriately adjusted to desired conditions.

Subsequently, nitrogen ions are implanted into parts of the multiple δ-doped layer 10 at a high concentration, thereby forming n$^+$ SiC layers 5 of about 400 nm depth, each of which reaches the upper portion of associated one of the p-SiC layers 4 through the multiple δ-doped layer 10. Then, p-type impurity ions are implanted into portions to be located under respective source electrodes 7b, thereby forming upper portions 4a of the p-SiC layers 4. This process step is necessary in order to control the potential of the oppositely doped regions and to prevent the breakdown of the DMOS device when a backward current flows, by bringing the source electrodes 7b into direct contact with the associated p-SiC layers 4. The latter will be described as follows. Normally, the load of a DMOS device is likely to be an inductive load (which is a load containing a lot of L-component, such as a coil of a motor), and thus a reverse voltage is applied between the source and drain due to electromagnetic induction at the moment when an off voltage is applied to the gate of the DMOS device. Specifically, the drain potential is lower than the source potential for a moment, whereby the PN diodes made of the p-SiC layers 4 and the n-SiC layer 3 are forward biased, so that a large current flows between the source and drain. At this time, if surface layers of n-type, which is the same type of the active region, were present between the source electrodes 7b and the respective p-SiC layers 4, the surface PN junctions between the n-type surface layers and the respective p-SiC layers 4 would be reverse biased. This would cause the surface PN junctions to act as resistance and produce heat, which may result in the breakdown of the device. Therefore, the upper portion 4a of each p-SiC layer 4 is formed in the portion to be located under each source electrode 7b for preventing the creation of the surface PN junctions.

Then, a gate insulating film 6 is formed out of a silicon oxide film, for example, over the substrate, and source and drain electrodes 7b and 7c are then formed out of Ni alloy films that have been formed by a vacuum evaporation method. Thereafter, an annealing process is performed at 1000° C. for three minutes so that the source and drain electrodes 7a and 7b can make an ohmic contact with their respective underlying layers. Subsequently, Ni is evaporated onto the gate insulating film 6, thereby forming a gate electrode 7a made of the Ni film and having a gate length of about 5 µm.

For the DMOS device (ACCUFET) formed by the forgoing process steps, the gate voltage dependence of current-voltage characteristics (i.e., the relationship between drain current and drain voltage) was examined, and it was found that the amount of saturation current was further increased as compared to the known DMOS device. In addition, a stable drain current was obtained without a breakdown even when the drain voltage was 400 V or higher. The dielectric breakdown voltage in the off state was 600 V or higher and the on-resistance was reduced to 1 mΩ·cm$^2$.

The thickness of the doped layers does not need to be thicker than necessary so long as the wave function of electrons effectively expands into the undoped layers from the doped layers. Combining the experimental examples and other simulation data, it was found that the preferable thickness of the n-type doped layers 10a (heavily doped layers) is at least one monolayer and less than 20 nm when an SiC layer is used. Further, it is sufficient that the thickness of the undoped layers 10b (lightly doped layers) falls within such a range as allows the wave functions of electrons to expand into the undoped layers from their respective underlying and overlying doped layers that are in contact therewith, and thus the thickness of the undoped layers 10b is preferably at least about 10 nm but not more than about 100 nm.

Further, a compound semiconductor layer other than the SiC layer may be used. Where a GaAs layer, AlGaAs layer, GaN layer, AlGaN layer, SiGe layer, or SiGeC layer, for example, is used, the appropriate thickness of the heavily doped layers (δ-doped layers) is determined according to the material. For example, if a GaAs layer is used, a δ-doped layer of one monolayer can be provided. It can be said that ordinarily, so long as carrier supply capabilities are appropriately maintained, in order to increase the breakdown voltage at the same thickness, it is preferable that the thickness of the heavily doped layers (δ-doped layers) is as thin as possible.

On the other hand, a part of the uppermost layer of the multiple δ-doped layer 10 is subjected to thermal oxidation so as to serve as a gate oxide film. Thus, if nitrogen as a donor is incorporated in large quantity into the gate oxide film, the threshold voltage of the MOS structure is adversely affected or the breakdown voltage of the gate oxide film itself decreases. For this reason, the uppermost layer of the multiple δ-doped layer 10 is preferably the undoped layer, and the thickness thereof has to be at least larger than the thickness of the part that is changed into the oxide film. For example, in order to form a thermal oxide film with a thickness of 40 nm, the undoped layer with a thickness of at least 20 nm is necessary.

If a p$^+$ SiC substrate containing a p-type impurity at a concentration of about $1\times10^{18}$ cm$^{-3}$ is used as the SiC substrate 2, an IGBT (see FIG. 9(b)), which will be described in a second embodiment, can be prototyped by a fabrication method similar to that in this embodiment. In that case, instead of nickel, a metal film (such as an aluminum film, a multilayer film of an aluminum film and a nickel film or a titanium film, or an alloy film made of an alloy of aluminum and nickel or titanium) which can obtain ohmic characteristics with respect to the p-type SIC layer is used as the drain electrode 7c. The IGBT obtained by this fabrication method had a lower on-resistance, which was 0.7 mΩ·cm$^2$.

Modified Example with Respect to Plan Configuration

Although the cells each in square shape are arranged in this embodiment as shown in FIG. 2, the plan configuration of each cell of the ACCUFET according to the present invention does not have to be a square but may be various in shape. For example, the plan configuration of each cell of the ACCUFET (or IGBT) may be hexagonal as in a modified example of a second embodiment, which will be described later. Since an SiC crystal is a hexagonal crystal, by forming an ACCUFET (or IGBT) whose plan configuration is a hexagon having the six sides that are in parallel with the associated directions of the crystal axes (A axes), the mobility of carriers can be increased.

Second Embodiment

In the first embodiment, the upper portions 4a of the p-SiC layers 4 are formed by implanting p-type impurity ions into parts of the multiple δ-doped layer 10 or the n$^+$ SiC layers 5 formed on the p-SiC layers 4 so that the source electrodes 7b are in direct contact with the respective p-SiC layers 4 that are the oppositely doped regions. After the p-SiC layers 4 have been extended to the surface in this manner, the source electrodes 7b, which are in direct contact with the respective p-SiC layers 4, are formed. According to this method, the ions of the p-type impurity have to be implanted at such a high concentration as is necessary to change the conductivity type of the n-type layers that have been doped heavily (i.e., the n-type doped layers 10a and the n$^+$ SiC layers 5). Aluminum or boron is used as the p-type impurity for the SiC layer. However, after the ions of such an impurity have been implanted, the activation rate thereof ranges from several percent to several tens percent. Thus, the implant dose has to be extremely high. However, in the SiC layer in which implantation defects are difficult to be recovered, the ion-implanted regions containing the impurity at such a high dose become high-resistance regions. Thus, when a current flows through such regions, a large resistance loss is caused. Also, the surface of the SiC layer becomes rough due to the ion implantation, making the characteristics worse. In view of this, the structure of and a fabrication method of a DMOS device that is free from the above-mentioned drawbacks and has excellent characteristics will be described in this embodiment.

Figure 6:
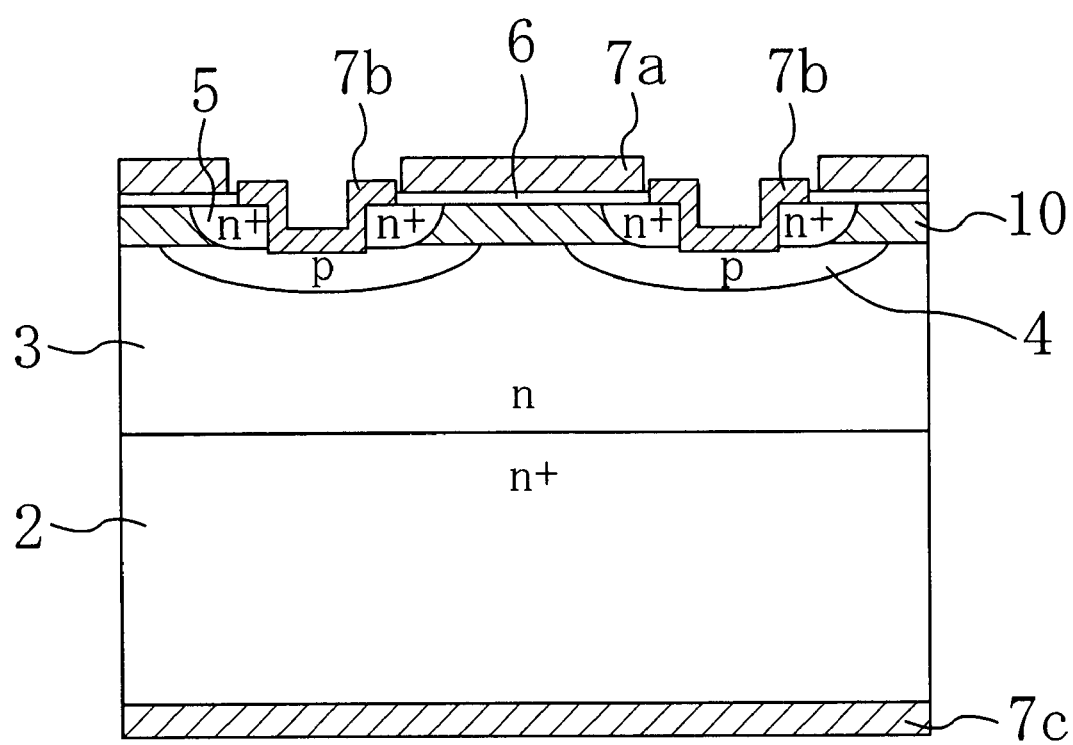
FIG. 6 is a cross-sectional view illustrating a DMOS device in a second embodiment of the present invention.

FIG. 6 is a cross-sectional view illustrating a DMOS device in this embodiment. In this embodiment, the DMOS device also has the plan configuration as shown in FIG. 2. As shown in the drawing, the DMOS device of this embodiment includes: an SiC substrate 2 (6H—SiC substrate), which contains an n-type impurity at a high concentration and the major surface of which is a (0001) off face; an n-SiC layer 3 (drift region), which is formed in an epitaxial layer formed on the SiC substrate 2 and which contains an n-type impurity at a low concentration; a gate insulating film 6 formed on the epitaxial layer; a gate electrode 7a formed on the gate insulating film; source electrodes 7b, which are formed so as to surround the gate electrode 7a on the epitaxial layer; a drain electrode 7c formed on the lower surface of the SiC substrate 2; p-SiC layers 4 formed by doping, with a p-type impurity, regions in the epitaxial layer, each of which is present from under each source electrode 7b to under associated edges of the gate electrode 7a; n$^+$ SiC layers 5 formed by doping, with an n-type impurity at a high concentration, regions in the epitaxial layer, each of which is present from under the edges of each source electrode 7b to under associated edges of the gate electrode 7a.

The characteristic of the DMOS device of this embodiment is that unlike the DMOS device of the first embodiment, openings are formed in parts of the multiple δ-doped layer 10 and the n$^+$ SiC layers 5, so that a part of each p-SiC layer 4 is exposed at the bottom face of an associated one of the openings and each source electrode 7b is in contact with the exposed part of an associated one of the p-SiC layers 4.

As in the DMOS device of the first embodiment, the multiple δ-doped layer 10 (i.e., active region) is formed in the surface portion of the epitaxial layer except in the portions where the n+ SiC layers 5 are formed, and this allows the DMOS device of this embodiment to function as an ACCUFET (Accumulation Mode FET). Further, the structure of the multiple δ-doped layer 10 is basically the same as that of the multiple δ-doped layer 10 in the DMOS device of the first embodiment. However, the multiple δ-doped layer 10 of this embodiment is formed by alternately stacking four undoped layers 10b (i.e., lightly doped layers) (the impurity concentration of which is about $5\times10^{15}$ cm$^{-3}$) each having a thickness of 40 nm in between four n-type doped layers 10a (i.e., heavily doped layers) (the impurity concentration of which is about $1\times10^{18}$ cm$^{-3}$) each having a thickness of about 10 nm, and then by forming the 40-nm-thick undoped layer 10b as the uppermost layer. The total thickness thereof is about 240 nm.

In the semiconductor power device, the n$^+$ SiC layers 5 function as source regions, the multiple δ-doped layer 10 functions as a channel region, and the SiC substrate 2 and the n-SiC layer 3 function as a drain region.

Next, a fabrication process of a DMOS device according to this embodiment will be described with reference to FIGS. 7(a) through 7(d) and FIGS. 8(a) through 8(d).

Figure 7A:
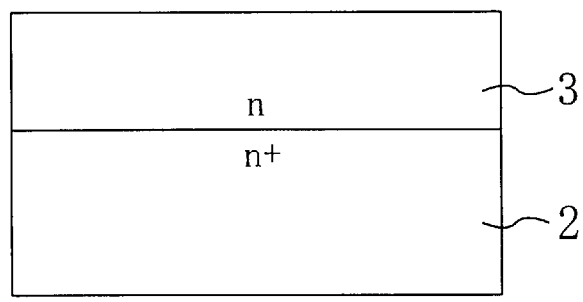
FIGS. 7(a) though 7(d) are cross-sectional views illustrating the first half part of the process steps for fabricating the DMOS device of the second embodiment of the present invention.

First, in the process step shown in FIG. 7(a), an n⁺-type SiC substrate 2, the principal surface of which is inclined from the (0001) plane (i.e., C plane) by several degrees, is prepared. The diameter of the SiC substrate 2 is 50 mm and the n-type impurity concentration thereof is $1 \times 10^{18}$ cm$^{-3}$. The SiC substrate 2 is thermally oxidized at 1100° C. for about three hours in a water vapor atmosphere through which oxygen is bubbled at a flow rate of 5 (l/min), and once a thermal oxide film of about 40 nm thickness is formed on the surface, the thermal oxide film is removed with buffered hydrofluoric acid (hydrofluoric acid:aqueous solution of ammonium fluoride=1:7). Then, the SiC substrate 2 is placed into a chamber in a CVD apparatus and the pressure inside the chamber is reduced until it reaches a vacuum degree of about $10^{-6}$ Pa ($\approx 10^{-8}$ Torr). Next, hydrogen and argon gases are supplied as dilution gases into the chamber at respective flow rates of 2 (l/min) and 1 (l/min), and the pressure inside the chamber is set to 0.0933 MPa. The temperature of the substrate is controlled to about 1600° C. Then, propane and silane gases are supplied as source gases into the chamber at respective flow rates of 2 (m/min) and 3 (ml/min), while the flow rates of the hydrogen and argon gases are held at the above-mentioned constant values. These source gases have been diluted with hydrogen gas at a flow rate of 50 (ml/min). Then, by opening a pulse valve for supplying a doping gas, in-situ doping with nitrogen is carried out, thereby forming, on the principal surface of the SiC substrate 2, an n-SiC layer 3 of about 12 μm thickness, which contains a low concentration (about $1 \times 10^{16}$ atoms/cm$^{-3}$) of nitrogen and which is made of an n-type single SiC crystal.

However, as disclosed in the specification and drawings of Japanese Patent Application 2000-58964, in order to supply a hydrogen gas containing about 10% nitrogen as a doping gas, the doping gas is stored in a high-pressure cylinder, and the pulse valve is provided between the high-pressure cylinder and a pipe for supplying the doping gas.

Figure 7B:
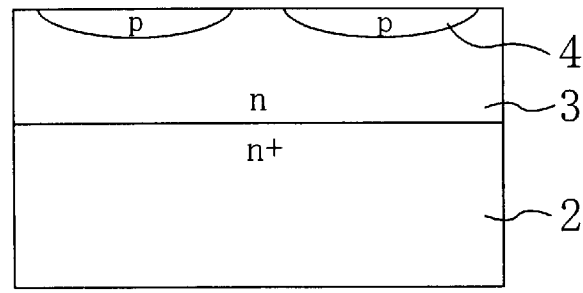

Next, in the step shown in FIG. 7(b), an implant mask (not shown) of SiO$_2$ is formed on the n-SiC layer 3. Then, aluminum (Al) ions as a p-type impurity are implanted into the n-SiC layer 3 from above the implant mask while the temperature of the SiC substrate 2 is kept high at 500° C. or more. Thereafter, the part of the surface region, into which the ions were not implanted, is removed by reactive ion etching (RIE). Then, annealing for activation is performed in an argon gas atmosphere at 1700° C., thereby forming p-SiC layers 4 that are oppositely doped regions. In this embodiment, the annealing for activation is performed after the RIE process has been carried out, but the RIE may be performed after the annealing process has been carried out for activation. However, by performing the annealing for activation after the RIE process has been carried out, defects caused by ion bombardment during the RIE process are easily recovered and deposits produced on the surface during the RIE process can also be removed.

Figure 7C:
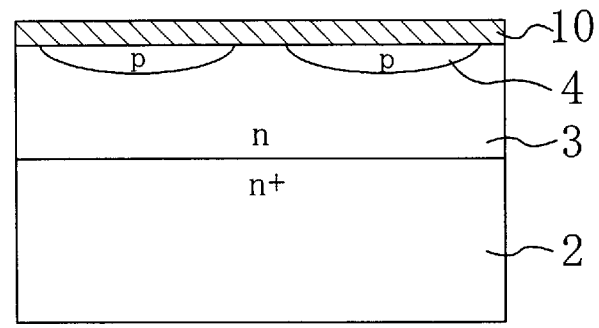

Thereafter, in the step shown in FIG. 7(c), a multiple δ-doped layer 10 is formed by the following procedures.

First, while the process conditions, such as the amounts of the source and dilution gases supplied and the temperature, under which the n-SiC layer 3 was formed are kept unchanged, by closing the pulse valve, an undoped layer 10b (the impurity concentration of which is confirmed to be about $5 \times 10^{15}$ cm$^{-3}$) is formed to have a thickness of 40 nm on the n-SiC layer 3. Next, while the conditions, such as the amounts of the dilution and source gases supplied into the chamber and the temperature, are still kept unchanged, the pulse valve is opened so that a pulsed gas (i.e., doping gas) containing aluminum as a p-type impurity is supplied. In this way, an n-type doped layer 10a (i.e., heavily doped layer) (the impurity concentration of which is about $1 \times 10^{18}$ cm$^{-3}$) is formed to a thickness of about 10 nm on the undoped layer 10b.

In this manner, each of the step of forming the n-type doped layer 10a by introducing the doping gas (nitrogen) through opening and closing of the pulse valve while simultaneously supplying the source and dilution gases, and the step of forming the undoped layer 10b by supplying only the source and dilution gases without supplying the doping gas by keeping the pulse valve closed, is repeated four times. Finally, as the uppermost layer, the undoped layer 10b of 40 nm thickness is formed. By the foregoing process, the multiple δ-doped layer 10 of about 240 nm thickness is formed.

Note that the undoped layer 10b serving as the uppermost layer of the multiple δ-doped layer 10 may have a thickness larger by about 50 nm than that of each of the other undoped layers 10b. However, in that case, the DMOS device has its threshold voltage increased. Thus, the thickness of the uppermost undoped layer 10b may be determined so that the channel mobility and the threshold voltage, harmfully affected by interface states present at the interface between the gate insulating film and the multiple δ-doped layer, are appropriately adjusted to desired conditions.

Figure 7D:
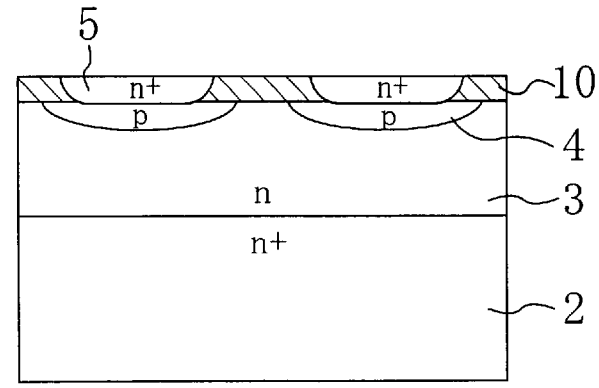

Next, in the step shown in FIG. 7(d), an implant mask (not shown) of SiO$_2$ is formed on the substrate. Then, while the temperature of the SiC substrate 2 is kept high at 500° C. or more, nitrogen (N) ions as an n-type impurity are implanted into the multiple δ-doped layer 10 from above the implant mask at a high concentration so that the implant depth is 300 nm. Then, after the implantation mask is removed, annealing for activation is performed in a chamber for SiC at 1600° C., thereby forming n⁺ SiC layers 5 serving as source regions. Each n⁺ SiC layer 5 extends through the multiple δ-doped layer 10 until its bottom comes into contact with associated one of the p-SiC layers 4. The n⁺ SiC layers 5 serving as the source regions are preferably in contact with all semiconductor layers forming the multiple δ-doped layer 10. Thus, it is preferable that the depth of the n⁺ SiC layers 5 is greater than the thickness of the multiple δ-doped layer 10.

Figure 8A:
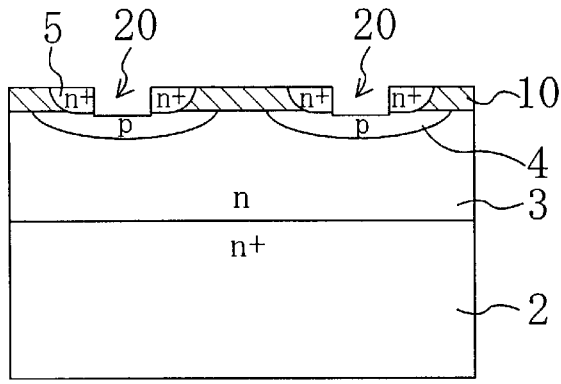
FIGS. 8(a) though 8(d) are cross-sectional views illustrating the latter half part of the process steps for fabricating the DMOS device of the second embodiment of the present invention.

Next, in the step shown in FIG. 8(a), part of each n⁺ SiC layer 5 (source region) is removed so that the surface of each p-SiC layer 4 is exposed. Thereafter, an aluminum thin film is deposited by evaporation over the substrate and patterned by photolithography and dry etching, thereby forming an etching mask (not shown). By using the etching mask, an RIE process using a mixed gas of CF$_4$ and O$_2$ (at a flow rate ratio of CF$_4$:O$_2$=4:1) is performed whereby openings 20 of 350 nm depth are formed to reach the respective p-SiC layers 4 through the respective n⁺ SiC layers 5. In this manner, a part of each p-SiC layer 4 is exposed at the bottom of associated one of the openings 20. In this situation, the depth of the openings 20 has to be at least greater than that of the n⁺ SiC layers 5 (i.e., source regions).

In this embodiment, where the mixed gas of CF$_4$ and O$_2$ is used as an etching gas, the etch rate is 67 nm/min. Since the etch rate hardly changes whether the n⁺ layers 5 are etched or the p-SiC layers 4 are etched, the etch rate can be regarded as almost constant. Thus, the depth of the openings 20 can be controlled according to etching time.

Figure 8B:
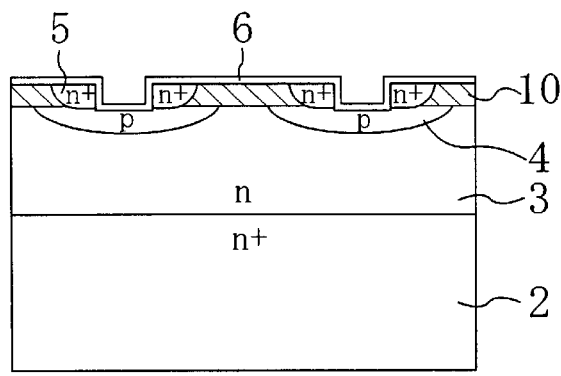

Next, in the step shown in FIG. 8(b), a thermal oxide film is formed on the substrate to serve as the gate insulating film 6. The surface portion of the layers over the SiC substrate 2 is thermally oxidized at 1100° C. for three hours in a water vapor atmosphere through which oxygen is bubbled at a flow rate of 2.5 (l/min), whereby a thermal oxide film of about 40 nm thickness is formed on the surface of the substrate.

Figure 8C:
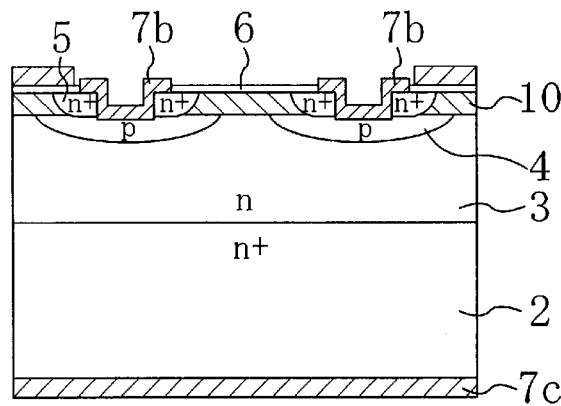

Subsequently, in the step shown in FIG. 8(c), a resist mask (not shown) having mask openings located over the openings 20 and the peripheral portions thereof is formed on the thermal oxide film that is to serve as the gate insulating film 6. Then, those areas of the thermal oxide film where it is located under the mask openings 20 of the resist mask are removed with buffered hydrofluoric acid, whereby the respective areas of the p-SiC layer 4 and n+ SiC layer 5 (source region) surfaces are exposed in the openings 20 and their peripherals. Thereafter, by a lift-off technique, source electrodes 7b are formed on the exposed areas of the p-SiC layer 4 and n+ SiC layer 5 surfaces. The source electrodes 7b are formed by the lift-off technique by the following steps. First, a nickel film is deposited to a thickness of about 200 nm over the substrate by an electron beam evaporation method, and the whole substrate is then immersed in an organic solvent whereby while the portions of the nickel film that are in contact with the parts of the p-SiC layers 4 and n+ SiC layers 5 are left, the other portions of the nickel film are peeled off the substrate.

Further, a Ni alloy film is deposited to a thickness of about 200 nm on the back face of the SiC substrate 2 by a vacuum deposition method, thereby forming a drain electrode 7c. Then, annealing is performed under the conditions including the temperature of 1000° C., for three minutes, and in an $N_2$ gas, for bringing the source and drain electrodes 7b and 7c into ohmic contact with their respective underlying layers.

Figure 8D:
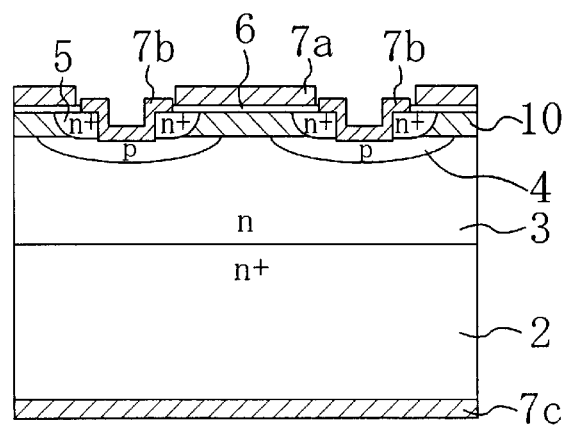

Next, in the step shown in FIG. 8(d), an aluminum film (not shown) is formed to a thickness of about 200 nm over the substrate by an electron beam evaporation method. Then, the aluminum film is patterned by photolithography and dry etching, thereby forming a gate electrode 7a having a gate length of about 10 μm.

Figure 11:
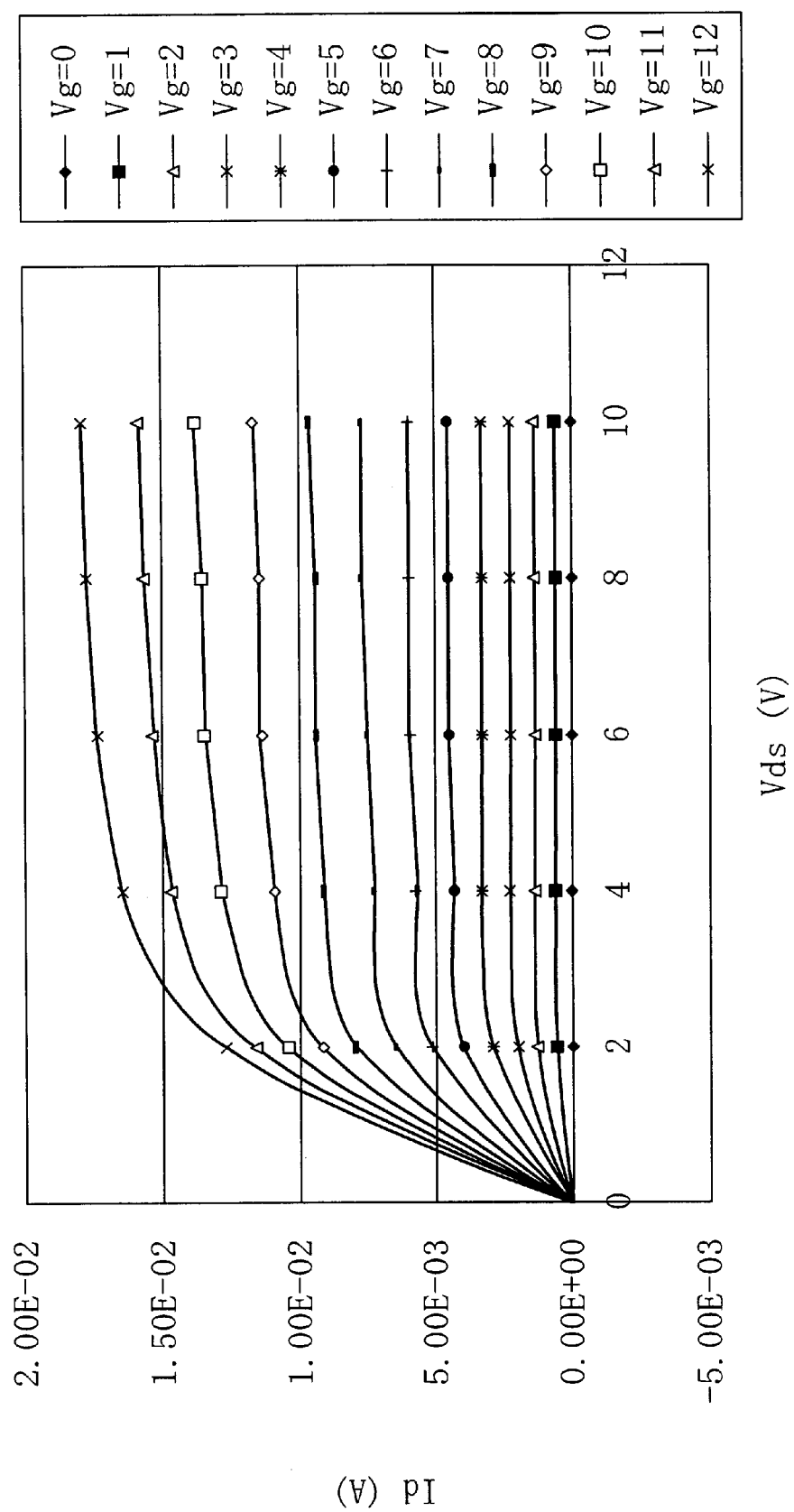
FIG. 11 is a diagram showing the current (I)-voltage (V) characteristics of the DMOS device of the second embodiment of the present invention.

FIG. 11 is a diagram showing the current (I)–voltage (V) characteristics of the DMOS device (ACCUFET) according to this embodiment. As shown in the diagram, the amount of saturation current further increases as compared with the known DMOS device.

The DMOS device of this embodiment can basically exhibit the effects the DMOS device of the first embodiment does.

In addition, in the DMOS device of this embodiment, each source electrode 7b is formed in an associated one of the openings 20 that have been formed through the respective n+ SiC layers 5. Thus, each source electrode 7b is in contact with an associated one of the p-SiC layers 4 without creating a region whose surface is made rough or which has a lot of defects due to an ion implantation performed at a high dose. Consequently, resistance under each of the source electrodes 7b is low when a reverse current flows through the multiple δ-doped layer 10, which provides the advantage that a resistance loss caused by the reverse current is small as compared with the first embodiment. Further, because of the small resistance loss, increase in temperature is also small when the reverse current flows. Thus, the breakdown of the DMOS device due to the reverse current can be suppressed more effectively.

If a p+ SiC substrate containing a p-type impurity at a concentration of about $1\times10^{18}$ cm$^{-3}$ is used as the SiC substrate 2, an IGBT can be prototyped by a fabrication method similar to that of this embodiment. In that case, instead of nickel, a metal film (for example, an aluminum film, a multilayer film of an aluminum film and a nickel film or a titanium film, or an alloy film made of an alloy of aluminum and nickel or titanium) that can obtain ohmic characteristics with respect to the p-type SiC layer is used as the drain electrode 7c. The IGBT obtained by this fabrication method had a lower on-resistance, which was 0.7 mΩ·cm$^2$.

Figure 9A:
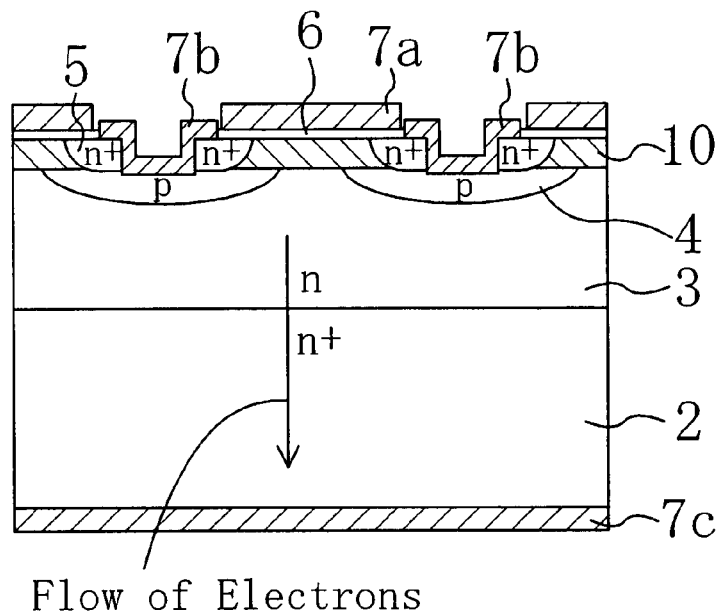
FIGS. 9(a) and 9(b) are cross-sectional views showing the difference in the components of the currents flowing in a DMOS device and an IGBT, respectively.
Figure 9B:
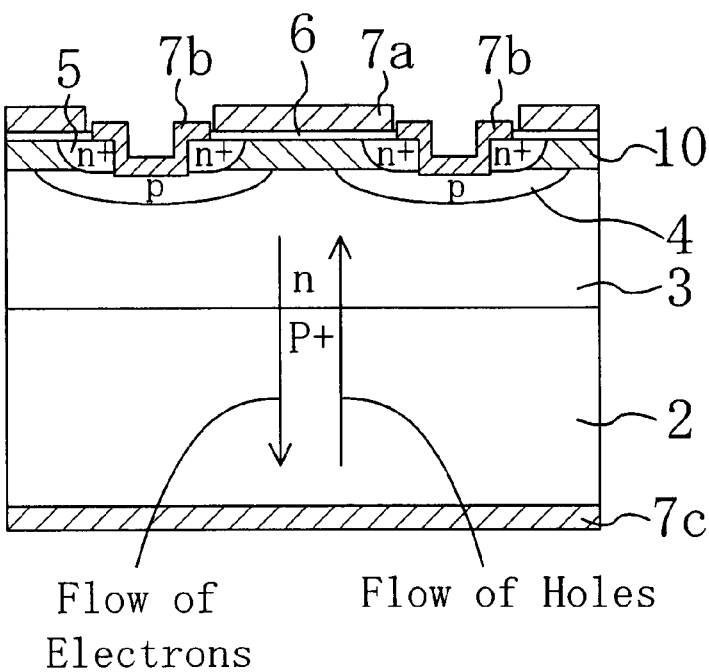

FIGS. 9(a) and 9(b) are cross-sectional views showing the currents flowing in a DMOS device and an IGBT, respectively, for comparison. As shown in FIG. 9(a), since the SiC substrate 2 and the drift region (i.e., n-SiC layer 3) are both n-type layers in the n-type DMOS device, only an electron current flows when the DMOS device is in its on state. In contrast, as shown in FIG. 9(b), the SiC substrate 2 is a p-type layer and the drift region (i.e., n-SiC layer 3) is an n-type layer in the IGBT. Accordingly, when the IGBT is in its on state, holes are supplied from the p-type SiC substrate 2 and not only an electron current but also a hole current flow, resulting in a further lowered on-resistance. However, for the case of the IGBT, when the IGBT is turned OFF, holes that have been injected into an n-type epitaxial layer go back to the p-type substrate, so that a reverse current flows. Thus, the switching speed of the IGBT is lower as compared with the DMOS device. Additionally, in the IGBT, a PN junction is formed between the SiC substrate 2 and the n-SiC layer 3, causing a voltage loss of several volts. Therefore, it can be said that the IGBT according to this embodiment has a structure suitable for a high-breakdown-voltage-type device whose breakdown voltage is designed to be about several kV.

Modified Example with Respect to Plan Configuration

As shown in FIG. 2, the cells each in square shape are arranged in this embodiment as in the first embodiment. However, the plan configuration of each cell of the ACCUFET according to the present invention does not have to be a square but may be various in shape.

Figure 10:
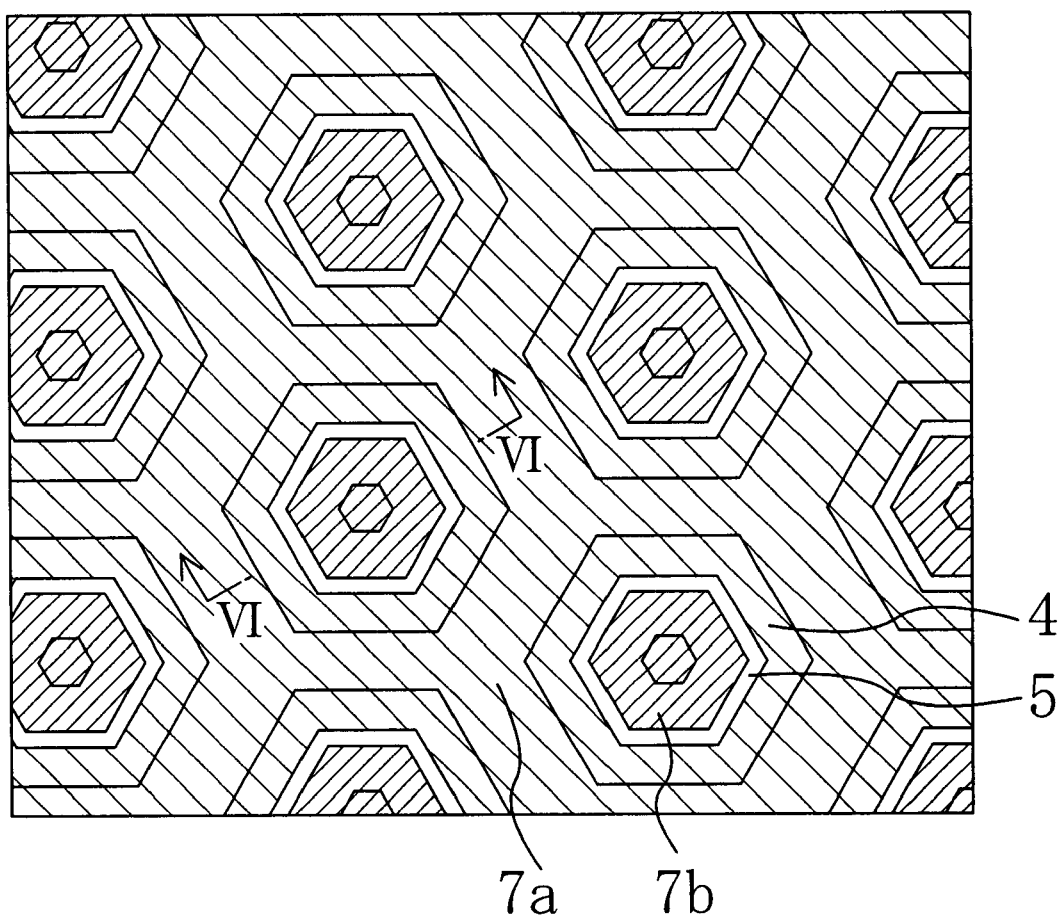
FIG. 10 is a top view showing the arrangement of the cells of a DMOS device according to a modified example of the second embodiment of the present invention.

FIG. 10 is a plan view showing a modified example of this embodiment, in which the plan configuration of each of the cells in an ACCUFET (or IGBT) is hexagonal. The cells are arranged at equal spaces and a honeycomb-shaped gate electrode 7a is provided.

In an ACCUFET (or IGBT), when depletion layers expanding from adjacent cells are combined with each other, a dielectric breakdown is less likely to occur. As shown in FIG. 2, when the cells each in the shape of a square are arranged at equal spaces, the spacing between adjacent-most vertices diagonally between any two cells is larger than the spacing between adjacent-most sides of any two adjoining cells. That is, even if depletion layers are combined with each other between the adjacent-most sides of the adjoining cells, there might be a part left in which depletion layers do not combine with each other between the adjacent-most vertices. As a result, a dielectric breakdown occurs more easily.

In contrast, for the case of the hexagon-shaped cells shown in FIG. 10, when depletion layers are combined with each other between the adjacent-most sides, the depletion layers also combine with each other between the adjacent-most vertices. Therefore, a dielectric breakdown is not likely to occur.

Also, the plan configuration of the cells of the ACCUFET (of IGBT) according to the present invention does not have to be a square or a hexagon but may be various in shape.

Further, in the second embodiment, the gate electrode 7a is formed after the process step of the ion implantation for forming the n+ SiC layers 5 serving as the source regions, the process step of forming the openings 20 and the process step of forming the source electrodes 7b have been carried out. However, the gate electrode 7a can be formed before those process steps. In that case, an aluminum film (which corresponds to the gate electrode in this example) having openings over the regions in which the n+ SiC layers 5 are to be defined is first formed on the thermal oxide film that is to serve as the gate insulating film 6. Then, ions of an n-type impurity are implanted using the aluminum film as a mask. Thereafter, formed are the openings that reach the respective p-SiC layers 4 through the respective n+ SiC layers 5 and then the source electrodes 7b. By the foregoing procedures, the gate electrode 7a and the source regions (i.e., n+ SiC layers 5) can be formed in a self-aligned manner, which provides a semiconductor device functioning as an ACCUFET or IGBT in a micro size. In that case, however, it is preferable that the gate electrode 7a is made of a material whose characteristics do not deteriorate in a process step performed at an elevated temperature during the formation of the source electrodes.

According to the semiconductor device of the present invention, in the semiconductor device functioning as a vertical type ACCUFET or IGBT, the portion acting as the channel region under the gate electrode is configured by alternately stacking first semiconductor layers and at least second semiconductor layers which contain an impurity for carriers at a concentration higher than the first semiconductor layers and are smaller in film thickness than the first semiconductor layers, and from which carriers spread out to the first semiconductor layers due to a quantum effect, so that the first and second semiconductor layers are in contact with each other. Carriers are supplied from the first semiconductor layers including a layer of a high concentration of an impurity, and then travel through the second semiconductor layers that contain few impurities, are of high quality and have good crystallinity. Thus, a high channel mobility and a high breakdown voltage can be realized at the same time.

INDUSTRIAL APPLICABILITY

The semiconductor device according to the present invention can be used in devices, such as ACCUFETs, vertical-type MOSFETs, DMOS devices, and IGBTs, that are mounted in electronic devices, and in particular, in devices and power devices handling high frequency signals.

What is claimed is:

1. A semiconductor device characterized by comprising:

a semiconductor substrate;

a compound semiconductor layer formed on the principal surface of the semiconductor substrate;

a gate insulating film formed on the compound semiconductor layer;

a gate electrode formed on the gate insulating film;

a source electrode formed at a side of the gate electrode on the compound semiconductor layer;

a drain electrode formed on a face of the semiconductor substrate, the face being opposed to the principal surface of the semiconductor substrate;

a source region, which is formed in the compound semiconductor layer and contains an impurity of a first conductivity type, the source region being present from under a part of the source electrode to under associated edges of the gate electrode;

an active region, which is formed in the compound semiconductor layer, contains an impurity of the first conductivity type, and functions as a region where carriers travel, the active region being located beneath the gate electrode;

a drift region, which is formed in the compound semiconductor layer and contains an impurity of the first conductivity type, the drift region being located under the gate electrode;

an oppositely doped region, which is formed between the drift region and the source region in the compound semiconductor layer and contains an impurity of a second conductivity type, wherein the active region includes one or more first semiconductor layers and one or more second semiconductor layers which contain an impurity for carriers at a concentration higher than the one or more first semiconductor layers and are smaller in film thickness than the one ore more first semiconductor layers and from which carriers spread out to the one or more first semiconductor layers due to a quantum effect.

2. The semiconductor device of claim 1, characterized in that the semiconductor substrate is of the first conductivity type.

3. The semiconductor device of claim 1, characterized in that the semiconductor substrate is of the second conductivity type.

4. The semiconductor device of any one of claims 1 through 3, characterized in that the active region is formed by stacking a plurality of the first semiconductor layers and a plurality of the second semiconductor layers.

5. The semiconductor device of any one of claims 1 through 4, characterized in that the one ore more second semiconductor layers are made of silicon carbide, and that the thickness of each of the one or more second semiconductor layers is at least one monolayer and less than 20 nm.

6. The semiconductor device of any one of claims 1 through 5, characterized in that the one or more first semiconductor layers are made of silicon carbide, and that the thickness of each of the one or more first semiconductor layers is not less than 10 nm and not more than 100 nm.

7. The semiconductor device of any one of claims 1 through 6, characterized by further comprising at least one heavily doped layer, which is formed laterally in the drift region to extend throughout the entire area of the drift region and which contains an impurity of the first conductivity type at a concentration higher than the drift region.

8. The semiconductor device of any one of claims 1 through 7, characterized by further comprising an opening that reaches the oppositely doped region through the source region, wherein the source electrode is formed on wall surfaces of the opening and is in direct contact with a part of the source region and a part of the oppositely doped region.

* * * * *

UNITED STATES PATENT AND TRADEMARK OFFICE
CERTIFICATE OF CORRECTION

PATENT NO. : 6,580,125 B2
DATED : June 17, 2003
INVENTOR(S) : Kitabatake et al.

It is certified that error appears in the above-identified patent and that said Letters Patent is hereby corrected as shown below:

Column 18,
Lines 22 and 36, "ore" should be -- or --;
Lines 34-35, "any one of claims 1 through 4" should be -- claim 1 --;
Lines 40-41, "any one of claims 1 through 5" should be -- claim 1 --;
Lines 46-47, "any one of claims 1 through 6" should be -- claim 1 --; and
Lines 52-53, "any one of claims 1 through 7" should be -- claim 1 --.

Signed and Sealed this

Twentieth Day of July, 2004

JON W. DUDAS
*Acting Director of the United States Patent and Trademark Office*